(12) United States Patent
Kong

(10) Patent No.: US 9,224,501 B2
(45) Date of Patent: Dec. 29, 2015

(54) METHOD OF OPERATING MEMORY DEVICE, MEMORY DEVICE USING THE SAME, AND MEMORY SYSTEM INCLUDING THE DEVICE

(71) Applicant: SAMSUNG ELECTRONICS CO., LTD., Suwon-Si, Gyeonggi-Do (KR)

(72) Inventor: Hyeong Sik Kong, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 56 days.

(21) Appl. No.: 14/208,172

(22) Filed: Mar. 13, 2014

(65) Prior Publication Data

US 2014/0269109 A1   Sep. 18, 2014

(30) Foreign Application Priority Data

Mar. 13, 2013 (KR) .......................... 10-2013-0026765

(51) Int. Cl.
*G11C 7/00* (2006.01)
*G11C 8/00* (2006.01)
*G11C 29/04* (2006.01)
*G11C 29/44* (2006.01)

(52) U.S. Cl.
CPC ................ *G11C 29/04* (2013.01); *G11C 29/44* (2013.01); *G11C 2029/0409* (2013.01)

(58) Field of Classification Search
USPC ................ 365/189.07, 200, 201, 230.03, 236
See application file for complete search history.

(56) References Cited

U.S. PATENT DOCUMENTS

| 6,515,922 | B1 * | 2/2003 | Yamagata ...................... 365/201 |
| 6,546,503 | B2 * | 4/2003 | Ooishi ........................... 365/201 |
| 6,560,733 | B1 | 5/2003 | Ochoa |
| 6,915,476 | B2 * | 7/2005 | Morino et al. ................ 365/200 |
| 7,710,764 | B2 | 5/2010 | Osada et al. |
| 7,755,958 | B2 * | 7/2010 | Byun et al. ..................... 365/201 |
| 8,537,628 | B2 * | 9/2013 | Kim et al. ...................... 365/201 |
| 8,687,444 | B2 * | 4/2014 | Ide et al. ........................ 365/200 |
| 8,711,646 | B2 * | 4/2014 | Ong ............................... 365/201 |
| 8,817,559 | B2 * | 8/2014 | Ide et al. ........................ 365/200 |
| 2007/0094569 | A1 | 4/2007 | Thayer et al. |
| 2008/0133994 | A1 | 6/2008 | Oh |
| 2011/0047439 | A1 | 2/2011 | Jorda et al. |
| 2012/0112295 | A1 | 5/2012 | Apalkov et al. |
| 2012/0127804 | A1 | 5/2012 | Ong et al. |

FOREIGN PATENT DOCUMENTS

| KR | 1020080013316 | 2/2008 |
| KR | 100809333 | 3/2008 |

* cited by examiner

*Primary Examiner* — Trong Phan
(74) *Attorney, Agent, or Firm* — F. Chau & Associates, LLC

(57) ABSTRACT

A memory device includes a control logic configured to control an overall operation of the memory device; a data storing unit configured to receive write data and write the write data according to control of the control logic and to output read data obtained by reading the write data; and a detector configured to repeatedly generate a comparison result based on the read data and a current determination result based on the comparison result and a previous determination result N times and to generate a final determination result according to a result of the repetition, where N is an integer of at least 2. The final determination result indicates whether an error has occurred and a type of the error.

20 Claims, 19 Drawing Sheets

FIG. 4B

| WRITE DATA (WD) | READ DATA (RD) | COMPARISON RESULT (CR) | PREVIOUS DETERMINATION RESULT (DRP) | CURRENT DETERMINATION RESULT (DR) |
|---|---|---|---|---|
| D | D/ | 1 | 1 | 1 |
| | D | 0 | 1 | 0 |
| | D/ | 1 | 0 | 0 |
| | D | 0 | 0 | 0 |

FIG. 7B

| FIRST READ DATA (RD1) | SECOND READ DATA (RD2) | COMPARISON RESULT (CR) | PREVIOUS DETERMINATION RESULT (DRP) | CURRENT DETERMINATION RESULT (DR) |
|---|---|---|---|---|
| D | D/ | 1 | 1 | 1 |
|  | D | 0 | 1 | 1 |
|  | D/ | 1 | 0 | 1 |
|  | D | 0 | 0 | 0 |
| D/ | D/ | 0 | 1 | 1 |
|  | D | 1 | 1 | 1 |
|  | D/ | 0 | 0 | 0 |
|  | D | 1 | 0 | 1 |

METHOD OF OPERATING MEMORY DEVICE, MEMORY DEVICE USING THE SAME, AND MEMORY SYSTEM INCLUDING THE DEVICE

CROSS-REFERENCE TO RELATED APPLICATIONS

This application claims priority under 35 U.S.C. §119(a) to Korean Patent Application No. 10-2013-0026765 filed on Mar. 13, 2013, the disclosure of which is incorporated by reference in its entirety herein.

BACKGROUND

1. Technical Field

Exemplary embodiments of the inventive concept relate to a memory device, and more particularly, to a method of determining a type of defect of a memory cell included in a memory device and a memory device using the method.

2. Discussion of Related Art

A memory device includes a plurality of memory cells that store data. To enable a system including the memory device to operate normally, errors in data stored therein need to be minimized. There are various causes of errors (defects) occurring in data in the memory cells. For instance, a data error may occur continuously because a memory cell has a physical fault, but there may be data errors that commonly occur during the operation of the memory device.

However, it can be difficult to correctly determine a type of the defect occurring in a memory cells and to treat the defect in a different manner depending on the type of the defect.

SUMMARY

According to an exemplary embodiment of the inventive concept, there is provided a method of operating a memory device. The method includes generating a current determination result based on a previous determination result and a comparison result generated based on read data read from a memory cell corresponding to a first address; storing the current determination result as the previous determination result; repeating the generating the current determination result and the storing the current determination result until the current determination result is generated N times, where N is an integer of at least 1; and generating a final determination result according to a result of the repetition. The final determination result indicates whether the memory cell corresponding to the first address has an error and a type of the error.

The comparison result may be a result of comparing write data to be written to the memory cell corresponding to the first address with the read data obtained by reading the write data from the memory cell corresponding to the first address.

The generating the current determination result may include storing the write data in a detector (e.g., a write error rate (WER) detector) that generates the current determination result, writing the write data to the memory cell corresponding to the first address, and generating the comparison result based on the read data obtained by reading the write data from the memory cell corresponding to the first address and the write data stored in the detector.

The generating the current determination result may further include receiving a mode register set (MRS) command, address information designating the first address, and the write data.

The method may further include receiving a built in self test (BIST) command and determining the first address and the write data.

Alternatively, the comparison result may be a result of comparing first read data read from the memory cell corresponding to the first address and second read data read from the memory cell corresponding to the first address after the first read data is read.

The generating of the current determination result may include storing the first read data in a detector that generates the current determination result, writing write data to the memory cell corresponding to the first address, and generating the comparison result based on the second read data obtained by reading the write data from the memory cell corresponding to the first address and the first read data stored in the detector.

The generating the current determination result may further include receiving a test MRS command, address information designating the first address, and the write data.

The method may further include receiving a BIST command and determining the first address and the write data.

N may be determined based on a write error rate of a memory cell array.

According to an exemplary embodiment of the inventive concept, there is provided a memory device including a control logic configured to control an overall operation of the memory device, a data storing unit configured to receive write data and write the write data according to control of the control logic and to output read data obtained by reading the write data, and a detector (e.g., a WER detector) configured to repeatedly generate a comparison result based on the read data and a current determination result based on the comparison result and a previous determination result N times and to generate a final determination result according to a result of the repetition, where N is an integer of at least 2. The final determination result indicates whether an error has occurred and a type of the error.

In an exemplary embodiment, the data storage unit includes a memory cell array having a plurality of memory cells, where the comparison result is a result of comparing the write data with the read data, the write data is data to be written to a memory cell corresponding to a first address among the plurality of memory cells, and the read data is data read from the memory cell corresponding to the first address after the write data is written to the memory cell corresponding to the first address.

The memory device may further include an address buffer configured to receive address information from an external device outside the memory device and to transmit the address information to the data storing unit according to the control of the control logic, a command buffer configured to receive a command from the external device outside the memory device and to transmit the command to the control logic, and a data input/output circuit configured to exchange the read data and the write data with the external device outside the memory device or the data storing unit according to the control of the control logic. The data storing unit may include a memory cell array including a plurality of memory cells, a plurality of word lines, and a plurality of bit lines; a row decoder and row driver block configured to select at least one of the word lines according to the address information; a column decoder and column driver block configured to select at least one of the bit lines according to the address information; and a write driver and sense amplifier block configured to write the write data to at least one memory cell selected according to the address information or to read the read data from the at least one memory cell.

The detector may include a data storing circuit configured to store the write data and to output the write data and the read data, a data comparing circuit configured to compare the write data with the read data and to generate the comparison result, and a defective type determination circuit configured to generate the current determination result based on the comparison result and the previous determination result and to store the current determination result as the previous determination result.

The data storing circuit may include a first latch configured to store the write data. The data comparing circuit may include an exclusive OR (XOR) gate configured to compare the write data with the read data. The defective type determination circuit may include a second latch configured to store the previous determination result and an AND gate configured to compare the previous determination result with the current determination result.

When the control logic receives a test MRS command, the first address may be determined based on the address information received from the external device outside the memory device and the write data may be data that the data input/output circuit receives from the external device outside the memory device.

When the control logic receives a BIST command, the first address may be determined according to BIST address information determined by the control logic and the write data may be determined by the control logic.

According to an exemplary embodiment of the inventive concept, there is provided a memory system including a memory device including a plurality of memory cells and a memory controller configured to transmit a command for controlling the memory device. The memory device may include a control logic configured to control an overall operation of the memory device according to the command; a data storing unit configured to receive write data and write the write data according to control of the control logic and to output read data obtained by reading the write data; and a detector (e.g., a WER detector) configured to repeatedly generate a comparison result based on the read data and a current determination result based on the comparison result and a previous determination result N times and to generate a final determination result according to a result of the repetition, where N is an integer of at least 2.

The comparison result may be a result of comparing the write data with the read data, the write data may be data to be written to a memory cell corresponding to a first address among the plurality of memory cells, and the read data may be data read from the memory cell corresponding to the first address after the write data is written to the memory cell corresponding to the first address.

Alternatively, the comparison result may be a result of comparing first read data among the read data with second read data among the read data, the first read data may be data read from a memory cell corresponding to a first address among the plurality of memory cells, and the second read data may be data read from the memory cell corresponding to the first address after the first read data is read and after the write data is written to the memory cell corresponding to the first address.

According to an exemplary embodiment of the inventive concept, there is provided an electronic system including a memory device including a plurality of memory cells, a memory controller configured to transmit a command for controlling the memory device, and a processor configured to process data stored in the memory device and to control the memory controller. The memory device repeatedly generates a current determination result by repeating a write operation and a read operation N times according to the command and generates a final determination result according to a result of the repetition, where N is an integer of at least 2. The final determination result indicates whether an error has occurred and a type of the error.

According to an exemplary embodiment of the inventive concept, there is provided a memory device including a memory cell array and a detector. The memory cell array includes a plurality of memory cells. The detector is configured to determine whether one of the memory cells has one of i) a soft error that requires correction and ii) a hard error that requires the one memory cell be replaced with another one of the memory cells. The detector determines that the one memory cell has the soft error by reading data from a same location within the one memory cell N times and any one of the N read data differ from one another. The detector determines that the one memory cell has the hard error by writing write data to the location M times, reading data from the location M times corresponding to each of the writes, and all of the M read data differs from the write data. The parameters M and N are integers of at least 2.

In an exemplary embodiment, a memory system is provided that includes the memory device and a memory controller, the memory controller includes an ECC circuit to correct the soft error and is configured to replace the one memory cell with another one of the memory cells when the hard error occurs. In an exemplary embodiment, the detector performs a detection to detect one of the hard error and the soft error based on a command received from the memory controller. In an exemplary embodiment, the memory device further includes a column driver connected to the memory cell array, a sense amplifier block connected to the column driver, a data I/O circuit connected to the memory controller, a first data path connecting the data I/O circuit to the sense amplifier block for transmitting data during a normal mode, a second data path connected the data I/O circuit to the sense amplifier block for transmitting data during a test mode, and the detector is only connected to the second data path. In an exemplary embodiment, the detector includes a first circuit having latch receiving the write data, an XOR gate receiving an output of the latch and one of the M read data, and an AND gate receiving an output of the XOR gate and a previous output of the AND gate. The first circuit may be used to detect the hard error. In an exemplary embodiment, the detector may include a second circuit having a latch receiving one of the N read data, an XOR gate receiving an output of the latch and another one of the N read data, and an OR gate receiving an output of the XOR gate and a previous output of the OR gate. The second circuit may be used to detect the soft error.

BRIEF DESCRIPTION OF THE DRAWINGS

The inventive concept will become more apparent by describing in detail exemplary embodiments thereof with reference to the attached drawings in which:

FIG. 4B is a diagram for explaining the operation of the hard defective type detecting circuit illustrated in FIG. 4A according to an exemplary embodiment of the inventive concept;

FIG. 7B is a diagram for explaining the operation of the soft defective type detecting circuit illustrated in FIG. 7A according to an exemplary embodiment of the inventive concept;

DETAILED DESCRIPTION

Figure 1:
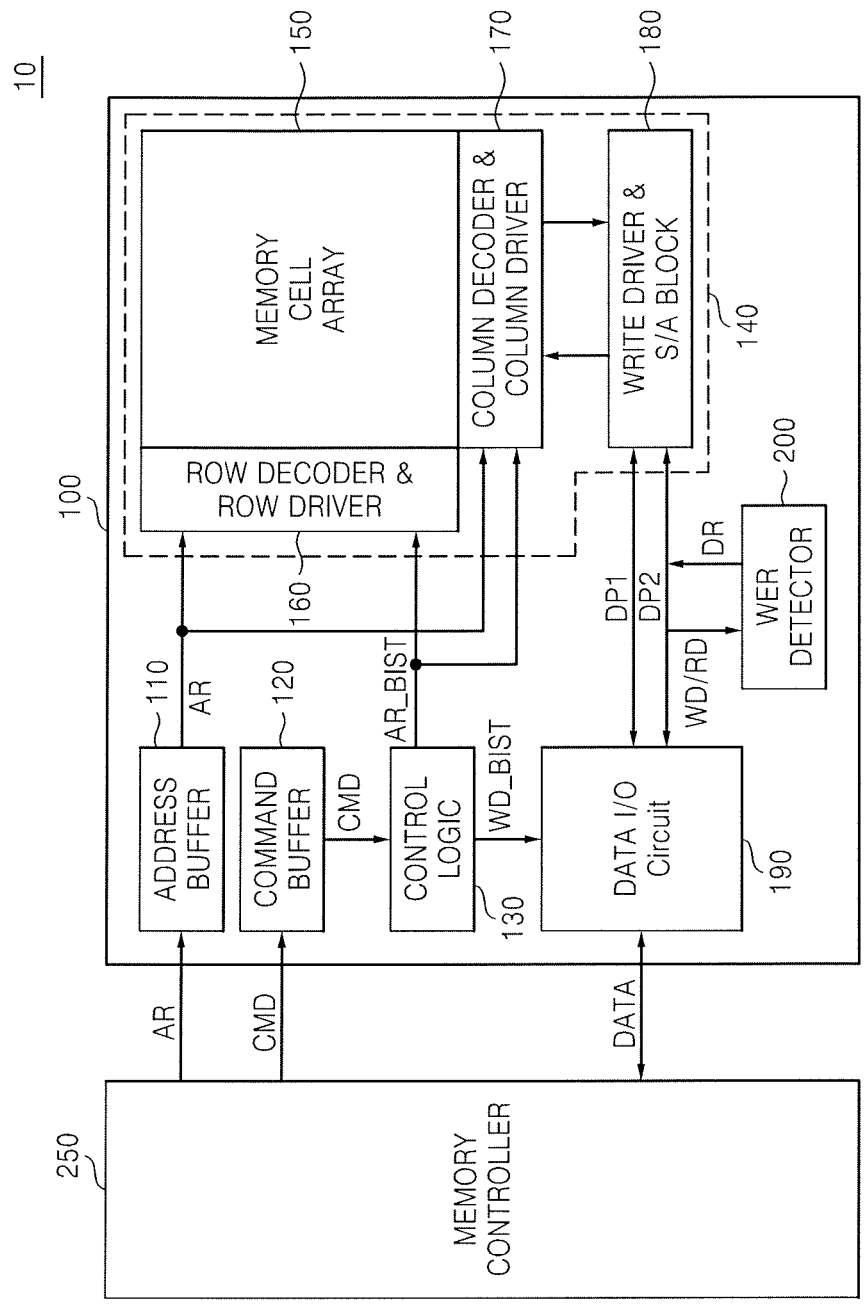
FIG. 1 is a block diagram of a memory system according to an exemplary embodiment of the inventive concept.

The inventive concept now will be described more fully hereinafter with reference to the accompanying drawings, in which exemplary embodiments of the invention are shown. This invention may, however, be embodied in many different forms and should not be construed as limited to the exemplary embodiments set forth herein. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. As used herein, the singular forms "a", "an" and "the" are intended to include the plural forms as well, unless the context clearly indicates otherwise. The term "unit", "driver", "detector", "logic", as used herein, may mean, but is not limited to, a software or hardware component, such as field programmable gate array, an application specific integrated circuit, a processor, a logic circuit, etc.

FIG. 1 is a block diagram of a memory system 10 according to an exemplary embodiment of the inventive concept. Referring to FIG. 1, the memory system 10 includes a memory device 100 and a memory controller 250.

The memory device 100 includes an address buffer 110, a command buffer 120, a control logic 130, a data storing unit 140, a data input/output (I/O) circuit 190, and a write error rate (WER) detector 200.

The address buffer 110 may receive address information AR from an external device, e.g., the memory controller 200, and temporarily store the address information AR. The address information AR may be information about an address designating at least one of a plurality of memory cells in a memory cell array 150 included in the data storing unit 140. The address information AR may also indicate locations within the designated memory cells. The address buffer 110 may include a latch (e.g., a flip flop) that can temporarily store the address information AR. The address buffer 110 may transmit the address information AR to the data storing unit 140 according to the control of the control logic 130. The address information AR stored in the latch included in the address buffer 110 may be changed by the control logic 130. For example, a communication channel (not shown) may be present between the control logic 130 and the address buffer 110 to enable the control logic 130 to adjust the contents of the address buffer 110.

The command buffer 120 may receive a command CMD from an external device, e.g., the memory controller 200, and temporarily store the command CMD. The command CMD may include information determining the operation mode of the memory device 100. For example, the operation modes may indicate whether a test is to be performed and the type of the test (e.g., test for a soft error, test for a hard error, etc.). The command buffer 120 may include a latch that can temporarily store the command CMD. The command buffer 120 may transmit the command CMD to the control logic 130 according to the control of the control logic 130.

The control logic 130 may control the overall operation of the memory device 100. The control logic 130 may include a command decoder (not shown), a clock generator (not shown), and a mode register set (MRS) circuit (not shown). The command decoder may decode the command CMD received from the command buffer 120 and internally generate a decoded command signal. The clock generator may generate and provide an internal clock signal for the memory device 100.

The MRS circuit may set all internal registers in response to the command CMD for designating the operation mode of the memory device 100 and/or the address information AR. The operation mode may be a read mode, a write mode, a test MRS mode, a vendor mode, or a built in self test (BIST) mode. A place for setting and storing the operation mode is referred to as a mode register. The MRS circuit may include a set of mode registers and may be used for a circuit test. The mode registers may be implemented separately from the memory cell array 150 or as part of the memory cell array 150.

The operation mode of the memory device 100 may be largely divided into test modes and non-test modes. For instance, the MRS circuit may be set to the test mode in response to a test MRS command or a BIST command. An exemplary operation of the memory device 100 responding to the test MRS command or the BIST command will be described in detail with reference to FIGS. 4A through 6 later. As an example, the test mode may indicate whether a particular procedure or detection circuit will be used to detect a soft error or a hard error.

The control logic 130 may transmit BIST address information AR_BIST to the data storing unit 140 or BIST write data WD_BIST to the data I/O circuit 190 when the memory device 100 operates in the BIST mode in response to the BIST command. The BIST write data WD_BIST may include data to be written during a test. The BIST address information AR_BIST may include locations of the memory cell array 150 in which to perform the test, the location of a test procedure within the memory cell array 150, locations of data within the memory cell array 150 for performing a test, etc.

The data storing unit 140 includes the memory cell array 150, a row decoder and row driver block 160, a column decoder and column driver block 170, and a write driver and sense amplifier (S/A) block 180.

The memory cell array 150 includes word lines, bit lines, and memory cells each connected with one of the word lines and one of the bit lines. The memory cells may store data having at least one bit. The memory cells may be implemented by a non-volatile memory that stores data regardless of power supply or a volatile memory that stores data only while power is being supplied. Physical fuse-cutting using a laser or electrical programming may be used to store data. The memory cells may be dynamic random access memory (DRAM) cells, static RAM (SRAM) cells, electrically erasable programmable read-only memory (EEPROM) cells, flash memory cells, magnetic RAM (MRAM) cells, conductive bridging RAM (CBRAM) cells, ferroelectric RAM (FeRAM) cells, phase-change RAM (PRAM) cells, or resistive RAM (RRAM or ReRAM) cells. The memory cell array 150 may be implemented in two dimensions or three dimensions. For example, the memory cells may be arranged on a single layer or on multiple layers stacked on top of one another.

The row decoder and row driver block 160 may select one of the word lines and drive the selected word line to a necessary operating voltage based on the address information AR output from the address buffer 110 or the BIST address information AR_BIST output from the control logic 130. The column decoder and column driver block 170 may control the connection between each of the bit lines and the write driver and S/A block 180 based on the address information AR output from the address buffer 110 or the BIST address information AR_BIST output from the control logic 130. For instance, when the address information AR designates a memory cell corresponding to a first address, the row decoder and row driver block 160 may select a word line including the memory cell corresponding to the first address among the word lines and the column decoder and column driver block 170 may connect a bit line including the memory cell corresponding to the first address to the write driver and S/A block 180.

The write driver and S/A block 180 may generate a current signal corresponding to write data received from the data I/O circuit 190 based on the write data and may apply the current signal to at least one bit line connected by the column decoder and column driver block 170. The write driver and S/A block 180 may also sense and amplify a current signal output from at least one bit line connected by the column decoder and column driver block 170, generate read data corresponding to the sensed and amplified current signal, and transmit the read data to the data I/O circuit 190.

The write driver and S/A block 180 may perform data communication with the data I/O circuit 190 through a first data path DP1 in a non-test mode (e.g., read mode or write mode) according to the control of the control logic 130. The write driver and S/A block 180 may also perform data communication with the data I/O circuit 190 through a second data path DP2 in a test mode (e.g., test MRS mode or BIST mode) according to the control of the control logic 130.

The data I/O circuit 190 may include a data input circuit (not shown) and a data output circuit (not shown), which are connected to a data I/O terminal. The data input circuit may receive write data from the data I/O terminal or BIST write data from the control logic 130 and transmit the write data to the data storing unit 140 during a write operation according to the control of the control logic 130. The data output circuit may output read data transmitted from the data storing unit 140 to an external device through the data I/O terminal during a read operation according to the control of the control logic 130. The data output circuit may also output a determination result DR generated by the WER detector 200 to an external device through the data I/O terminal. The determination result DR may be a current determination result or a final determination result. The data I/O terminal may be implemented by a data masking pad, a data I/O pad, or a data strobe pad.

In an exemplary embodiment, the WER detector 200 senses write data WD or read data RD received through the second data path DP2 in test mode (e.g., test MRS mode or BIST mode) and generates the determination result DR. The determination result DR may be transmitted to the data I/O circuit 190 through the second data path DP2. The operation of the WER detector 200 will be described in detail with reference to FIG. 2 below.

The memory controller 250 may transmit various commands CMD for controlling the operation of the memory device 100 and the address information AR regarding the memory cell array 150, on which the read or write operation or the test will be performed, to the memory device 100. The memory controller 250 may also transmit the write data WD to be written to the memory cell array 150 to the memory device 100 and receive the read data RD or the determination result DR from the memory device 100.

Figure 2:
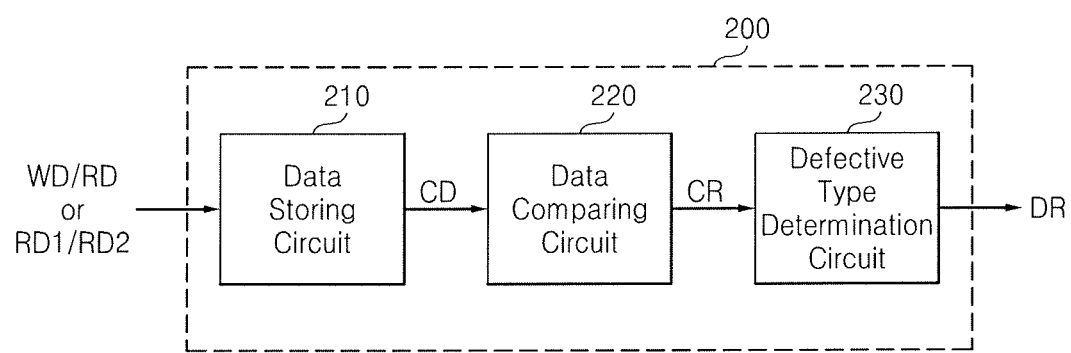
FIG. 2 is a detailed block diagram of a write error rate (WER) detector illustrated in FIG. 1 according to an exemplary embodiment of the inventive concept.

FIG. 2 is a detailed block diagram of the WER detector 200 illustrated in FIG. 1 according to an exemplary embodiment of the inventive concept. Referring to FIGS. 1 and 2, the WER detector 200 includes a data storing circuit 210, a data comparing circuit 220, and a defective type determination circuit 230. The WER detector 200 may operate in a hard defective type detecting mode or a soft defective type detecting mode according to the control of the control logic 130. In the hard defective type detecting mode the WER detector 200 is configured to detect a hard error (e.g., a physical fault in memory), and in the soft defective type mode the WER detector 200 is configured to detect a soft error. For example, a soft error is an error that can be potentially corrected using an error correcting code circuit or algorithm. Since a hard error refers to a defect within a portion of the memory itself, it may be necessary to flag this portion of the memory as defective so that another portion of the memory can be used in its place. The WER detector 200 may include a hard defective type detecting circuit (200-1 in FIG. 4A) and/or a soft defective type detecting circuit (200-2 in FIG. 7A). When the WER detector 200 includes both the hard defective type detecting circuit and the soft defective type detecting circuit, it may also include a mode selection circuit (not shown) controlled by the control logic 130 to activate only either the hard defective type detecting circuit or the soft defective type detecting circuit.

The data storing circuit 210 may sense and store data received through the second data path DP2 and transmit comparison data CD to the data comparing circuit 220. In an exemplary embodiment, in the hard defective type detecting mode, the data storing circuit 210 stores the write data WD received through the second data path DP2 and transmits the write data WD and the read data RD sequentially received thereafter to the data comparing circuit 220. In an exemplary embodiment, in the soft defective type detecting mode, the data storing circuit 210 stores first read data RD1 received through the second data path DP2 and transmits the first read data RD1 and second read data RD2 sequentially received thereafter to the data comparing circuit 220.

The data comparing circuit 220 receives the comparison data CD, performs a comparison, generates a comparison result CR, and transmits the comparison result CR to the defective type determination circuit 230. In an exemplary embodiment, in the hard defective type detecting mode, the data comparing circuit 220 compares the read data RD with the write data WD and generates the comparison result CR. The comparison result CR is transmitted to the defective type determination circuit 230. In an exemplary embodiment, in the soft defective type detecting mode, the data comparing circuit 220 compares the first read data RD1 with the second read data RD2 and generates the comparison result CR. The comparison result CR is transmitted to the defective type determination circuit 230.

The defective type determination circuit 230 may generate the current determination result DR using the comparison result CR and a previous determination result that has been stored in advance and may store the current determination result DR as the previous determination result. The defective type determination circuit 230 may also count the number of times the current determination result DR is generated up to a target value and transmit a count result to the control logic 130. In an exemplary embodiment, when the current determination result DR is generated as many times as the target value, the defective type determination circuit 230 outputs the current determination result DR lastly generated as a final determination result according to the control of the control logic 130.

Figure 3:
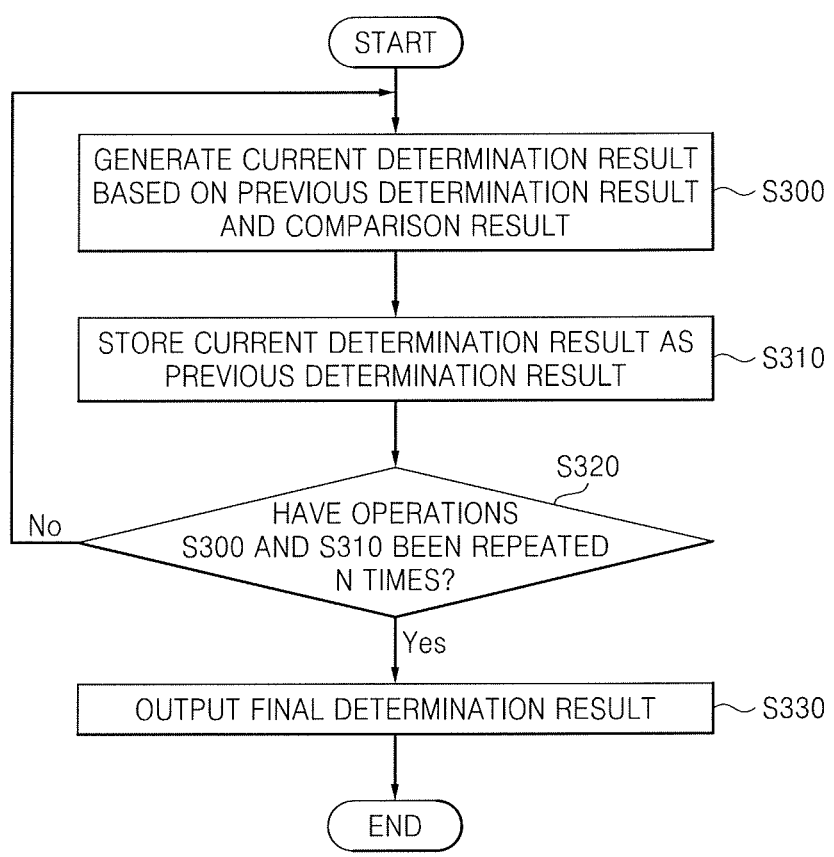
FIG. 3 is a flowchart of the operations of the WER detector illustrated in FIG. 2 according to an exemplary embodiment of the inventive concept.

FIG. 3 is a flowchart of the operations of the WER detector 200 illustrated in FIG. 2 according to an exemplary embodiment of the inventive concept. Referring to FIGS. 1 through 3, the data storing circuit 210 may sense and store data received through the second data path DP2 and transmit the comparison data CD to the data comparing circuit 220. The data comparing circuit 220 may receive the comparison data CD, perform a comparison, and generate and transmit the comparison result CR to the defective type determination circuit 230. The defective type determination circuit 230 generates the current determination result DR using the comparison result CR and a previous determination result that has been stored before (S300).

The defective type determination circuit 230 stores the current determination result DR as the previous determination result (S310). The defective type determination circuit 230 may also count the number of times the current determination result DR has been generated until the number of times reaches a target number N and transmit a count result to the control logic 130. When the count result is less than the target number N (in case of NO in S320), the WER detector 200 repeats operations S300 and S310 and generates the current determination result DR according to the control of the control logic 130. When the count result is equal to the target number N (in case of YES in S320), the defective type determination circuit 230 outputs the current determination result DR lastly generated as a final determination result according to the control of the control logic 130 (S330).

Figure 4A:
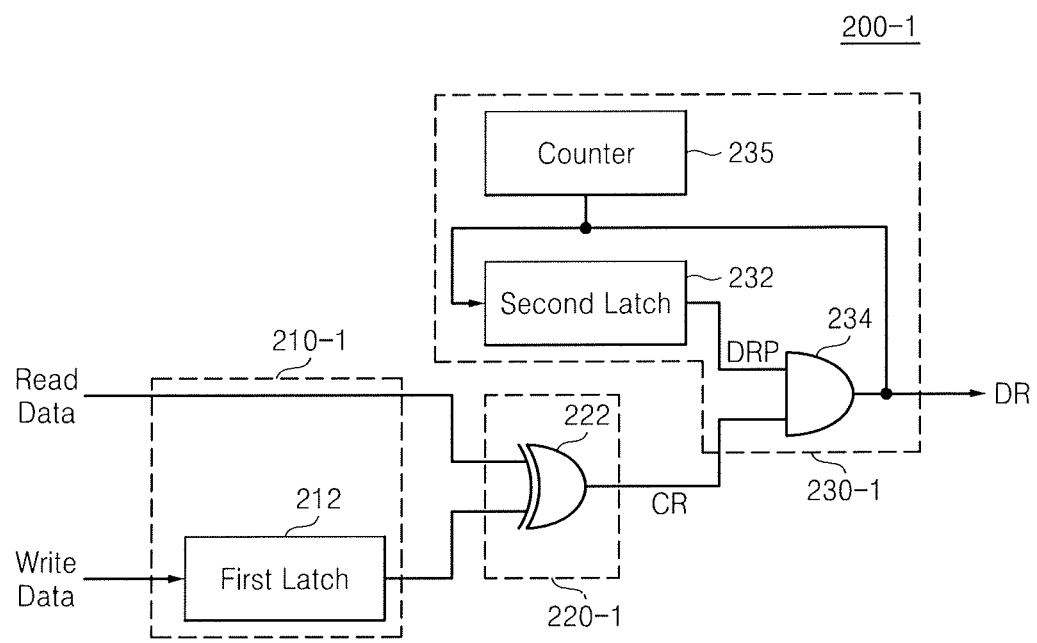
FIG. 4A is a block diagram of a hard defective type detecting circuit included in the WER detector illustrated in FIG. 2 according to an exemplary embodiment of the inventive concept.

FIG. 4A is a block diagram of the hard defective type detecting circuit 200-1 included in the WER detector 200 illustrated in FIG. 2 according to an exemplary embodiment of the inventive concept. FIG. 4B is a diagram for explaining the operation of the hard defective type detecting circuit 200-1 illustrated in FIG. 4A. Referring to FIGS. 1 through 4B, the hard defective type detecting circuit 200-1 that may be included in the WER detector 200 includes a data storing circuit 210-1, a data comparing circuit 220-1, and a defective type determination circuit 230-1.

The data storing circuit 210-1 may include a first latch 212 that senses the second data path DP2 and stores the write data WD to be written to the memory cell corresponding to a first address. After the write data WD is written to the memory cell corresponding to the first address, the data storing circuit 210-1 may sense the second data path DP2, read the read data RD from the memory cell corresponding to the first address, and output the read data RD and the write data WD stored in the first latch 212.

The data comparing circuit 220-1 includes an exclusive OR (XOR) gate 222. The XOR gate 222 performs a logic operation on the write data WD and the read data RD and outputs the comparison result CR.

The defective type determination circuit 230-1 includes a second latch 232 storing a previous determination result DRP, an AND gate 234 comparing the previous determination result DRP with the comparison result CR, and a counter 235 counting the number of times the previous determination result DRP has been generated.

The second latch 232 receives an output of the AND gate 234, i.e., the determination result DR and stores the determination result DR as the previous determination result DRP. The second latch 232 may be reset by the control logic 130 before the WER detector 200 starts determining a defective type with respect to one of the memory cells included in the memory cell array 150. When the second latch 232 is reset by the control logic 130, it may be reset to a high level "1". For example, the second latch may be reset when a determination is to be performed with respect to a new memory cell or a new location within that memory cell.

The AND gate 234 receives an output of the second latch 232, i.e., the previous determination result DRP and an output of the data comparing circuit 220-1, i.e., the comparison result CR, performs a logic operation on the previous determination result DRP and the comparison result CR, and outputs the current determination result DR. The comparison result CR and the current determination result DR may be determined as shown in FIG. 4B.

When the write data WD is D, e.g., D=0, the read data RD may be D (e.g., D=0) or D/(e.g., D/=1). When the write data WD is the same as the read data RD, the comparison result CR is 0. When the write data WD is different from the read data RD, the comparison result CR is 1. When either the comparison result CR or the previous determination result DRP is 0, the current determination result DR is 0. When both the comparison result CR and the previous determination result DRP are 1, the current determination result DR is 1.

That the write data WD and the read data RD are different from each other means that a write error has occurred and that the comparison result CR is 1. Contrarily, that the write data WD and the read data RD are the same as each other means that there has been no write error and that the comparison result CR is 0.

The current determination result DR is a result of performing an AND operation on the previous determination result DRP and the comparison result CR. The previous determination result DRP may be reset to an initial value of 1. Accordingly, when the determination result DR is generated as many times as the target number N, the comparison result CR must be 1 consecutively in order to make the final determination result 1. Contrarily, to make the final determination result 0, the comparison result CR must be 0 at least one time while the current determination result DR is generated as many times as the target number N.

When the final determination result is 1, the defect of the memory cell is determined as a hard defect. When the final determination result is 0, the memory cell is determined as not having a hard defect. For example, if N is 5, and the read data and the write data are different from one another 5 times, the comparison result CR would indicate that the memory cell has a hard defect, but if any one of those 5 times the read data and the write data is the same, the comparison result would indicate that the memory cell has no hard defect.

When a hard defect is incorrectly processed as a soft defect, the write error correction may not be properly performed due to excessive ECC fail bits. Contrarily, when the soft defect is processed as the hard defect, a memory cell with no physical fault is replaced with a redundancy cell. Therefore, it is necessary to distinguish hard defect from soft defects. In particular, distinguishing between hard defects and soft defects may useful for an MRAM, which can have a high probability of an occurrence of a write error.

After generating the current determination result DR as many times as the target number N, the WER detector 200 outputs the current determination result DR generated lastly as the final determination result to distinguish a hard defect from a soft defect. The target number N may be an arbitrary number or be determined depending on a characteristic of the memory cell array 150. The characteristic of the memory cell array 150 may be a WER. The WER is a rate at which a write error occurs in a memory cell. The WER may be the rate at which a write error occurs in a memory cell that does not have a hard defect.

A method of determining the target number N when the WER is 6% or 5 parts per million (ppm) will be described with reference to Table 1 below as an example.

TABLE 1

| WER | Looping | 1 | 2 | 3 | 4 | 5 | 6 | 7 | 8 | 9 |
|---|---|---|---|---|---|---|---|---|---|---|
| 6% | WER ppm | 60000 | 3 | 216 | 13 | 1 | 0 | 0 | 0 | 0 |
|  | Number of defects per 1 Gb | 6.0E+07 | 3.6E+06 | 2.2E+05 | 1.3E+04 | 7.8E+02 | 4.7E+01 | 2.8E+00 | 1.7E−01 | 1.0E−02 |
| 5 ppm | WER ppm | 5 | 0 | 0 | 0 | 0 | 0 | 0 | 0 | 0 |
|  | Number of defects per 1 Gb | 5.0E+0.3 | 2.5E−01 | 1.3E−06 | 6.3E−12 | 3.1E−17 | 1.6E−22 | 7.8E−28 | 3.9E−33 | 2.0E−38 |

The counter 235 may count the number of times the current determination result DR has been generated and transmit a count result to the control logic 130. The counter 235 may be reset by the control logic 130 before the WER detector 200 starts determining the defective type of one of the memory cells included in the memory cell array 150. The counter 235 may be reset to 0. For example, after one of the memory cells has been tested, before performing a test on another memory cell, the counter 235 may be reset to 0. When the count result of the counter 235 indicates that the current determination result DR has been generated as many times as the target number N, the WER detector 200 completes the defective type determination on the current memory cell and outputs the current determination result DR as the final determination result according to the control of the control logic 130.

When the memory controller 250 controls the determination on whether the current determination result DR has been generated as many times as the target number N, for example, when the memory controller 250 checks the number of transmissions of a command such as a test MRS command or a BIST command, the counter 235 may be omitted.

In case of a hard defect, since the memory cell has a physical fault, a write error will occur continuously. However, in case of soft defect, the memory cell does not have physical fault, but a write error may consecutively occur a certain number of times due to the operating characteristic of the memory cell.

Since a memory cell with a hard defect has a physical fault, a repair needs to be performed by replacing the memory cell with a redundancy cell. However, for a memory cell with a soft defect, write error correction needs to be performed using an error correction code (ECC) circuit (not shown).

In a case where the WER is 6%, a probability of occurrence of a write error is 60000 ppm when a defect determination test is performed once. When it is converted on the basis of 1 Giga bit (Gb) in the memory cell array 150, a write error may occur once per 6.0E+07 bits.

It is assumed that a write error is caused by a soft defect. In this case, when a write error occurs even after the defect determination test is repeated until the soft defect consecutively occurs in one bit or less per 1 Gb (that is, even after the test is performed eight times when the WER is 6%), the defect may be determined to not be the soft defect. In other words, when the defect determination test is repeated eight times on a memory cell, a probability that a soft defect occurs eight times consecutively is 1 bit or less per 1 Gb, and therefore, a type of defect in the memory cell may be determined according to the final determination result after the test is repeated eight times. Accordingly, the target number N may be set to 8 or a value exceeding 8 to increase reliability.

When the target number N is determined to be the number of tests enabling the probability that a soft defect occurs eight times consecutively to be 1 bit or less per 1 Gb in the same manner as described above in a case where the WER is 5 ppm, the target number N may be set to 2.

The target number N may be stored in part of the memory cell array 150 or may be determined by a command such as a test MRS command or a BIST command.

Figure 5:
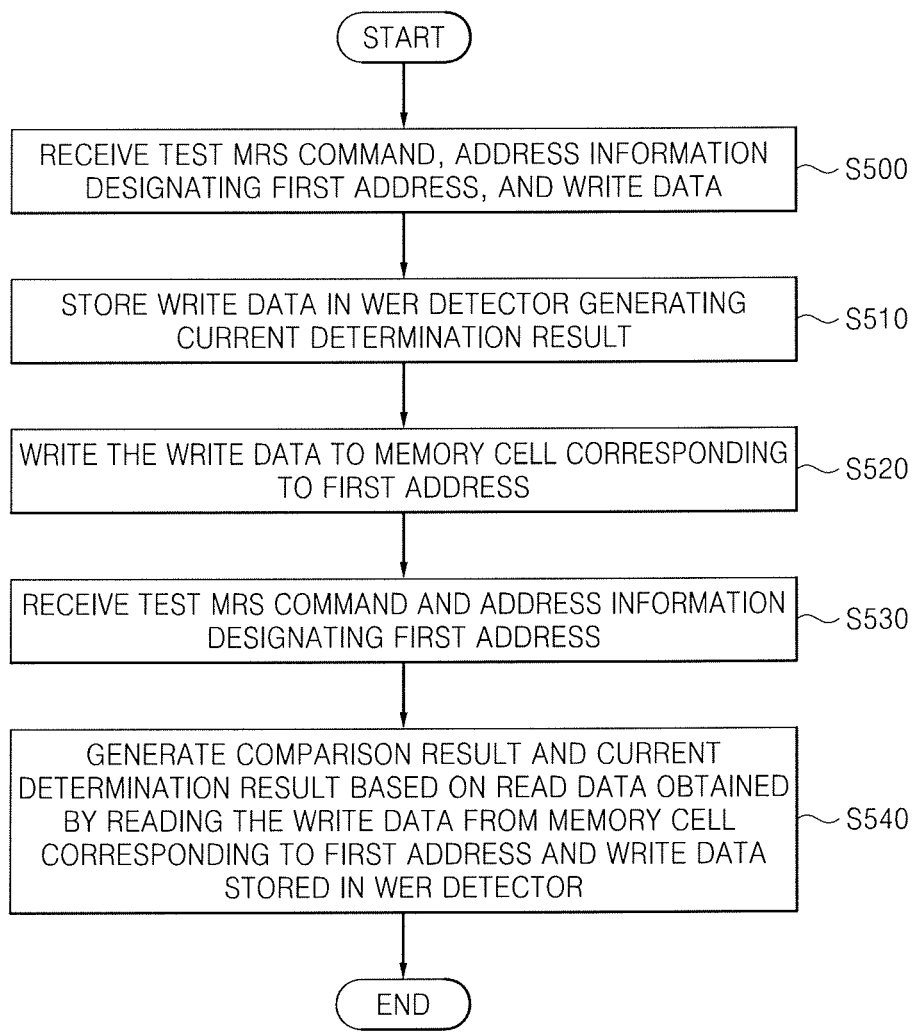
FIG. 5 is a flowchart of an operation in which a memory device including the hard defective type detecting circuit illustrated in FIG. 4A generates a current determination result in the method illustrated in FIG. 3 according to an exemplary embodiment of the inventive concept.

FIG. 5 is a flowchart of an operation in which the memory device 100 including the hard defective type detecting circuit 200-1 illustrated in FIG. 4A generates the current determination result DR in the method illustrated in FIG. 3 according to an exemplary embodiment of the inventive concept. Referring to FIGS. 1 through 5, the memory device 100 may receive a test MRS command, the address information AR designating the first address, and the write data WD from the memory controller 250 (S500). The test MRS command accompanied by the write data WD may be a command for controlling the memory device 100 to perform a write operation. When the control logic 130 receives the test MRS command, the write driver and S/A block 180 exchanges data with the data I/O circuit 190 through the second data path DP2 according to the control of the control logic 130. The first address may be determined based on the address information AR that the address buffer 100 receives from the memory controller 250.

The WER detector 200 may sense the second data path DP2 and store the write data WD output from the data I/O circuit 190 (S510). The write driver and S/A block 180 may write the write data WD to a memory cell, which is activated in response to the address information AR and corresponds to the first address (S520).

The memory device 100 may receive a test MRS command and the address information AR designating the first address from the memory controller 250 (S530). The test MRS command that is not accompanied by the write data WD may be a command for controlling the memory device 100 to perform a read operation.

The write driver and S/A block 180 may read data from the memory cell corresponding to the first address and output the read data RD. The WER detector 200 may sense the second data path DP2, compare the read data RD output from the write driver and S/A block 180 with the write data WD that has been stored, and generate the comparison result CR. In addition to the comparison result CR, the WER detector 200 may generate the current determination result DR based on the comparison result CR and the previous determination result DRP (S540).

Alternatively, the memory device 100 does not receive the test MRS command every time when performing the read operation and the write operation to generate the current determination result DR. In an exemplary embodiment, the memory device 100 receives an MRS command to enter a test mode. The memory device 100 repeats the write operation and the read operation according to a write command, a read command, the address information AR, and the write data WD which are received after the MRS command and generates the current determination result DR.

Figure 6:
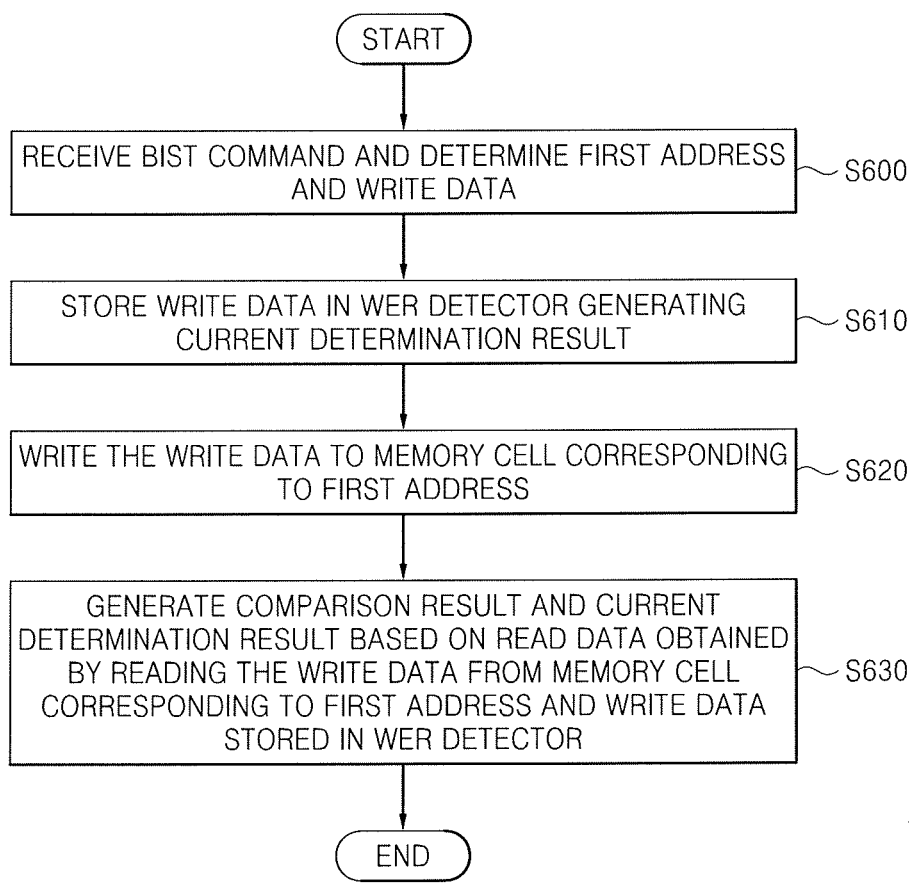
FIG. 6 is a flowchart of an operation in which a memory device including the hard defective type detecting circuit illustrated in FIG. 4A generates a current determination result in the method illustrated in FIG. 3 according to an exemplary embodiment of the inventive concept.

FIG. 6 is a flowchart of an operation in which the memory device 100 including the hard defective type detecting circuit 200-1 illustrated in FIG. 4A generates the current determination result DR in the method illustrated in FIG. 3 according to an exemplary embodiment of the inventive concept. Referring to FIGS. 1 through 6, the memory device 100 receives a BIST command from the memory controller 250. When the control logic 130 receives the BIST command, it determines the BIST address information AR_BIST designating the first address and the BIST write data WD_BIST determining the write data WD (S600).

The control logic 130 may determine the first address sequentially or randomly so that the defective type determination by the WER detector 200 can be completed with respect to some or all of the memory cells included in the memory cell array 150. In addition, the write data WD may be randomly determined by the control logic 130. In an exemplary embodiment, the write data WD is maintained constant during the defective type determination by the WER detector 200. An example, of a random write could be writing a different value into the same location several times and an example of constant write could be writing a same value in the same location several times.

The WER detector 200 may sense the second data path DP2 and store the write data WD output from the data I/O circuit 190 in response to the BIST write data WD_BIST (S610). The write driver and S/A block 180 write the write data WD to a memory cell, which is activated in response to the BIST address information AR_BIST and corresponds to the first address (S620).

The write driver and S/A block 180 may read data from the memory cell corresponding to the first address and output the read data RD according to the control of the control logic 130. The WER detector 200 may sense the second data path DP2, compare the read data RD output from the write driver and S/A block 180 with the write data WD stored before, and generate the comparison result CR. In addition to the comparison result CR, the WER detector 200 may generate the current determination result DR based on the comparison result CR and the previous determination result DRP (S630).

Consequently, the memory device 100 may receive the BIST command from the memory controller 250 and may output as the final determination result the current determination result DR lastly generated after generating the current determination result DR as many times as the target number N with respect to each of the memory cells included in the memory cell array 150.

Alternatively, whenever receiving the BIST command from the memory controller 250, the memory device 100 may generate and output the current determination result DR with respect to each of the memory cells included in the memory cell array 150. The memory controller 250 may check the number of transmissions of the BIST command and may transmit the BIST command to the memory device 100 as many times as the target number N, and the current determination result DR lastly generated may be the final determination result.

Figure 7A:
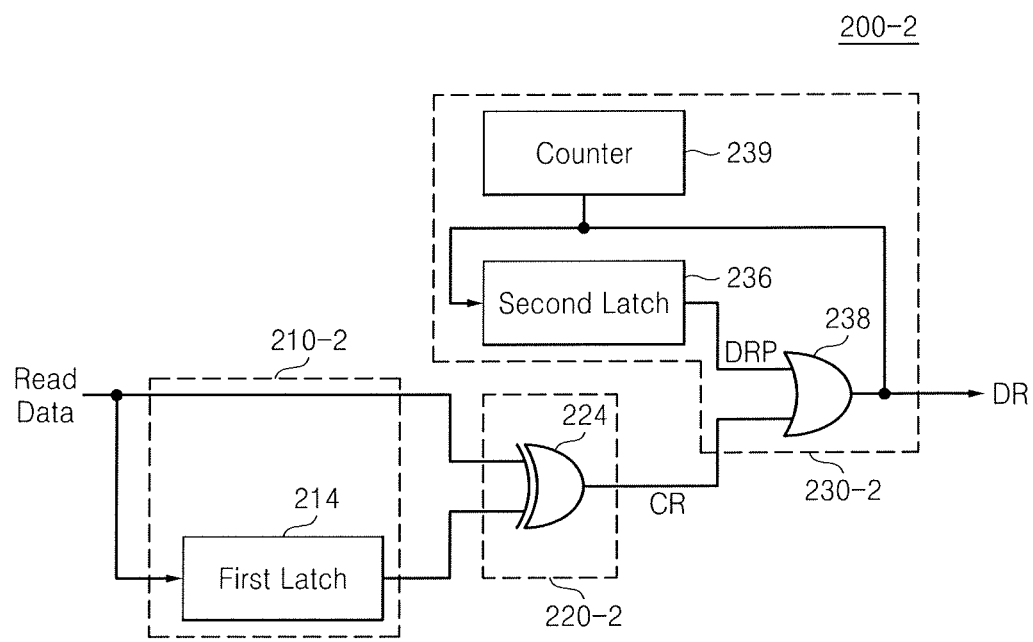
FIG. 7A is a block diagram of a soft defective type detecting circuit included in the WER detector illustrated in FIG. 2 according to an exemplary embodiment of the inventive concept.

FIG. 7A is a block diagram of the soft defective type detecting circuit 200-2 included in the WER detector 200 illustrated in FIG. 2 according to an exemplary embodiment of the inventive concept. FIG. 7B is a diagram for explaining the operation of the soft defective type detecting circuit 200-2 illustrated in FIG. 7A.

Referring to FIGS. 1 through 4A and FIG. 7A, the soft defective type detecting circuit 200-2 that may be included in the WER detector 200 includes a data storing circuit 210-2, a data comparing circuit 220-2, and a defective type determination circuit 230-2. The soft defective type detecting circuit 200-2 illustrated in FIG. 7A is similar to the hard defective type detecting circuit 200-1 illustrated in FIG. 4A, and therefore differences from the hard defective type detecting circuit 200-1 will be mainly described.

After the write data WD is written to the memory cell corresponding to the first address, a first latch 214 included in the data storing circuit 210-2 may sense the second data path DP2 and store the first read data RD1 output from the memory cell corresponding to the first address. Thereafter, the data storing circuit 210-2 may sense the second data path DP2, receive the second read data RD2 output from the memory cell corresponding to the first address, and output the first read data RD1 stored in the first latch 214 and the second read data RD2 to the data comparing circuit 220-2.

The data comparing circuit 220-2 includes an XOR gate 224 that performs a logic operation on the first read data RD1 and the second read data RD2 and outputs the comparison result CR.

The defective type determination circuit 230-2 includes a second latch 236 storing the previous determination result DRP, an OR gate 238 comparing the previous determination result DRP with the comparison result CR, and a counter 239 counting the number of times the previous determination result DRP has been generated. The second latch 236 may be reset by the control logic 130 to, for example, a low level "0".

The OR gate 238 receives an output of the second latch 236, i.e., the previous determination result DRP and an output of the data comparing circuit 220-2, i.e., the comparison result CR, performs a logic operation on the previous determination result DRP and the comparison result CR, and outputs the current determination result DR. The comparison result CR and the current determination result DR may be determined as shown in FIG. 7B.

As shown in FIG. 7B, the comparison result CR is 1 when the first read data RD1 is different from the second read data RD2 and the comparison result CR is 0 when the first read data RD1 is the same as the second read data RD2.

It is assumed that the second latch 236 storing the previous determination result DRP is reset to "0". At this time, when the comparison result CR is 1 at least once while the determination operation is performed a plurality of times by the soft defective type detecting circuit 200-2, the current determination result DR becomes 1. However, when the comparison result CR is 0 all the times through the determination operation, the current determination result DR becomes 1.

When the first read data RD1 is different from the second read data RD2, this means that a write error has occurred and thus the current determination result DR is 1. When the final determination result is 1, the memory cell is determined to have a soft defect. When the final determination result is 0, the memory cell is determined to not have a soft defect. Consequently, when the final determination result is 1, the memory cell may be processed as a cell with a soft defect.

The soft defective type detecting circuit 200-2 may generate the final determination result after repeating the defective type determination as many times as the target number N. The target number N may be determined based on the characteristic, e.g., the WER, of the memory cell array 150. For example, if N is 5, the first read data RD1 and the second read data RD2 would need to be the same all 5 times to rule out a soft defect, and if they are different from one another any one of the 5 times, it would be ruled a soft defect.

For instance, when the WER is 1%, this means that a write error may occur at a probability of $\frac{1}{100}$. Therefore, the target number N needs to be at least 100. When the WER is 1 ppm, this means that a write error may occur at a probability of $\frac{1}{1000000}$. Therefore, the target number N needs to be at least 1000000.

The counter 239 performs substantially the same operation as the counter 235 illustrated in FIG. 4A. When the memory controller 250 controls the determination on whether the current determination result DR has been generated as many times as the target number N, for example, when the memory controller 250 checks the number of transmissions of a command such as a test MRS command or a BIST command, the counter 239 may be omitted. The target number N may be stored in part of the memory cell array 150 or may be determined by a command such as a test MRS command or a BIST command.

Figure 8:
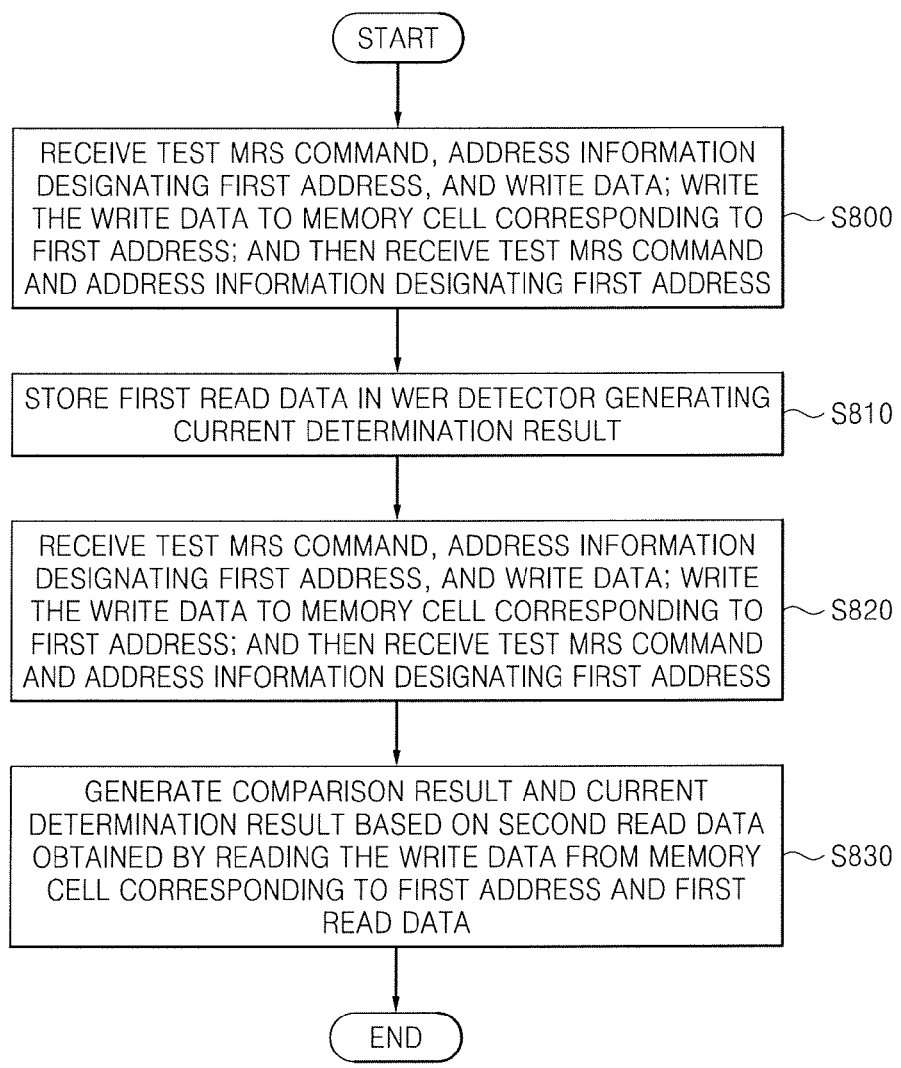
FIG. 8 is a flowchart of an operation in which a memory device including the soft defective type detecting circuit illustrated in FIG. 7A generates a current determination result in the method illustrated in FIG. 3 according to an exemplary embodiment of the inventive concept.

FIG. 8 is a flowchart of an operation in which the memory device 100 including the soft defective type detecting circuit 200-2 illustrated in FIG. 7A generates the current determination result DR in the method illustrated in FIG. 3 according to an exemplary embodiment of the inventive concept. Referring to FIGS. 1 through 8, the memory device 100 may receive a test MRS command, the address information AR designating the first address, and the write data WD from the memory controller 250. The test MRS command accompanied by the write data WD may be a command for controlling the memory device 100 to perform a write operation. When the control logic 130 receives the test MRS command, the write driver and S/A block 180 exchanges data with the data I/O circuit 190 through the second data path DP2 according to the control of the control logic 130. The first address may be determined based on the address information AR that the address buffer 100 receives from the memory controller 250.

The write driver and S/A block 180 may write the write data WD to a memory cell, which is activated in response to the address information AR and corresponds to the first address. After receiving the test MRS command, address information AR, and write data WD, and writing the data, the memory device 100 may receive the test MRS command and the address information AR designating the first address from the memory controller 250 (S800). The test MRS command that is not accompanied by the write data WD may be a command for controlling the memory device 100 to perform a read operation.

The write driver and S/A block 180 may read data from the memory cell corresponding to the first address and output the first read data RD1. The WER detector 200 may sense the second data path DP2 and store the first read data RD1 output from the write driver and S/A block 180 (S810).

Thereafter, the memory device 100 may perform substantially the same operation as operation S800 (S820). The address information AR and the write data WD received by the memory device 100 in operation S820 may be the same as those received in operation S800.

The write driver and S/A block 180 may read data from the memory cell corresponding to the first address and output the second read data RD2. The WER detector 200 may sense the second data path DP2, compare the second read data RD2 output from the write driver and S/A block 180 with the first read data RD1 stored before, and generate the comparison result CR. In addition to the comparison result, the WER detector 200 may generate the current determination result DR based on the comparison result CR and the previous determination result DRP (S830).

Alternatively, the memory device 100 does not receive the test MRS command every time when performing the read operation and the write operation to generate the current determination result DR. In an exemplary embodiment, the memory device 100 receives an MRS command to enter a test mode. The memory device 100 may repeat the write operation and the read operation according to a write command, a read command, the address information AR, and the write data WD which are received after the MRS command and generate the current determination result DR.

Figure 9:
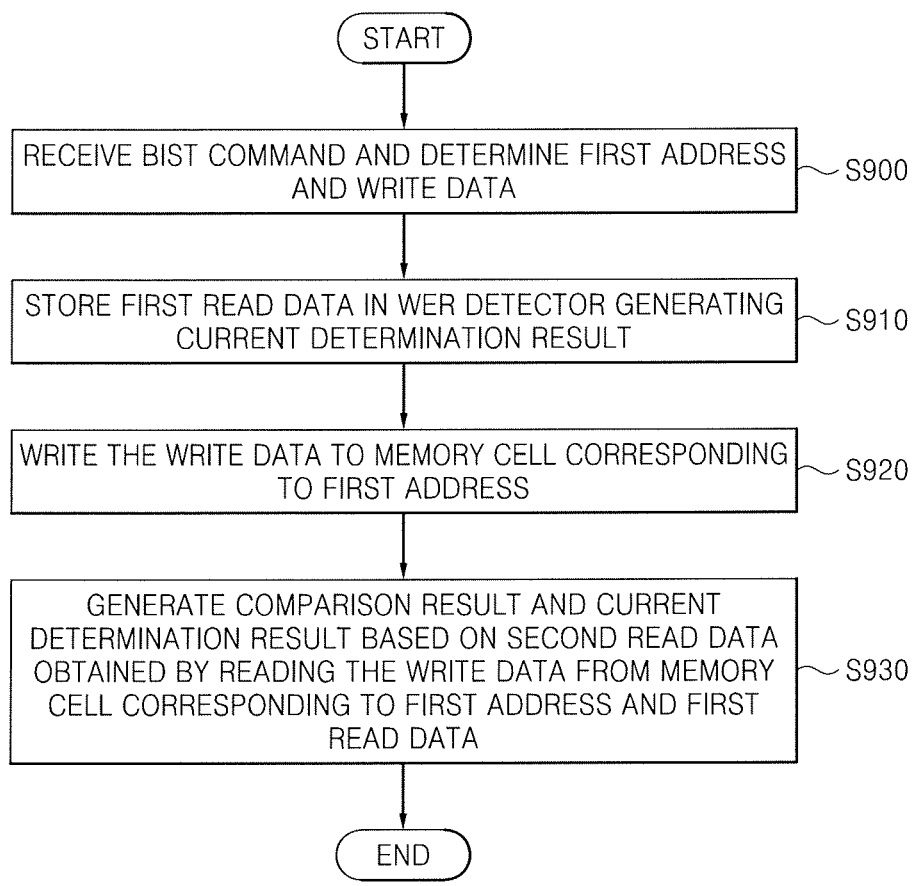
FIG. 9 is a flowchart of an operation in which a memory device including the soft defective type detecting circuit illustrated in FIG. 7A generates a current determination result in the method illustrated in FIG. 3 according to an exemplary embodiment of the inventive concept.

FIG. 9 is a flowchart of an operation in which the memory device 100 including the soft defective type detecting circuit 200-2 illustrated in FIG. 7A generates the current determination result DR in the method illustrated in FIG. 3 according to an exemplary embodiment of the inventive concept. Referring to FIGS. 1 through 9, the memory device 100 may receive a BIST command from the memory controller 250. When the control logic 130 receives the BIST command, it may determine the BIST address information AR_BIST designating the first address and the BIST write data WD_BIST determining the write data WD (S900).

The control logic 130 may determine the first address sequentially or randomly so that the defective type determination by the WER detector 200 can be completed with respect to some or all of the memory cells included in the memory cell array 150. In addition, the write data WD may be randomly determined by the control logic 130. In an exemplary embodiment, the write data WD is maintained constant during the defective type determination by the WER detector 200.

The data I/O circuit 190 may output the write data WD based on the BIST write data WD_BIST. The write driver and S/A block 180 may write the write data WD to a memory cell activated based on the BIST address information AR_BIST designating the first address and then read data from the memory cell and output the first read data RD1.

The WER detector 200 may sense the second data path DP2 and store the first read data RD1 (S910). The write driver and S/A block 180 may write the write data WD to the memory cell corresponding to the first address (S920).

The write driver and S/A block 180 may read data from the memory cell corresponding to the first address and output the second read data RD2 according to the control of the control logic 130. The WER detector 200 may sense the second data path DP2, compare the second read data RD2 output from the write driver and S/A block 180 with the first read data RD1 stored before, and generate the comparison result CR. In addition to the comparison result CR, the WER detector 200 may generate the current determination result DR based on the comparison result CR and the previous determination result DRP (S930).

Consequently, the memory device 100 may receive the BIST command from the memory controller 250 and may output as the final determination result the current determination result DR lastly generated after generating the current determination result DR as many times as the target number N with respect to each of the memory cells included in the memory cell array 150.

Alternatively, whenever receiving the BIST command from the memory controller 250, the memory device 100 may generate and output the current determination result DR with respect to each of the memory cells included in the memory cell array 150. The memory controller 250 may check the number of transmissions of the BIST command and may transmit the BIST command to the memory device 100 as many times as the target number N, and the current determination result DR lastly generated may be the final determination result.

Figure 10:
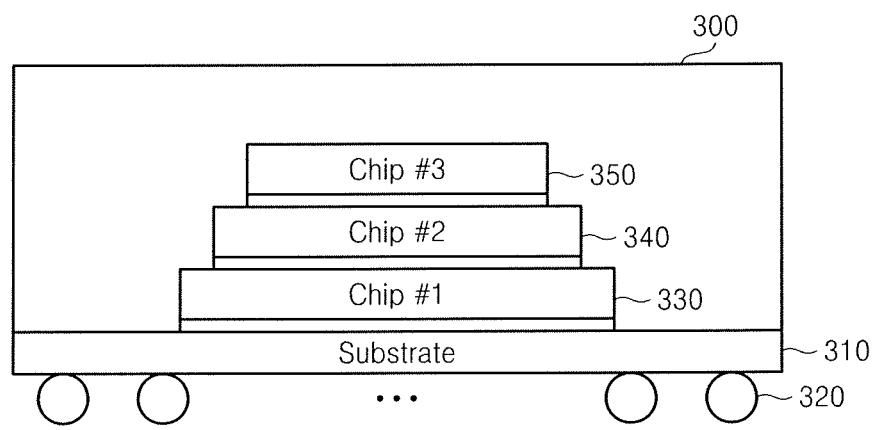
FIG. 10 is a conceptual diagram of a package including a memory device illustrated in FIG. 1 according to an exemplary embodiment of the inventive concept.

FIG. 10 is a conceptual diagram of a package 300 including the memory device 100 illustrated in FIG. 1 according to an exemplary embodiment of the inventive concept. Referring to FIGS. 1 and 10, the package 300 includes a plurality of semiconductor devices 330 (Chip #1), 340 (Chip #2), and 350 (Chip #3) which are sequentially stacked on a package substrate 310. Each of the semiconductor devices 330 through 350 may be the memory device 100.

The package 300 may be implemented by a package on package (PoP), a ball grid array (BGA), a chip scale package (CSP), a plastic leaded chip carrier (PLCC), a plastic dual in-line package (PDIP), a die in wafer form, a chip on board (COB), a ceramic dual in-line package (CERDIP), a plastic metric quad flat pack (MQFP), a thin quad flat pack (TQFP), a small outline integrated circuit (SOIC), a shrink small outline package (SSOP), a thin small outline package (TSOP), a system in package (SIP), a multi chip package (MCP), a wafer-level package (WLP), or a wafer-level processed stack package (WSP).

A memory controller (not shown) may be implemented within at least one of the semiconductor devices 330 through 350 or may be implemented on the package substrate 310. An electrical vertical connection means, e.g., a through-silicon via (TSV), may be used to electrically connect the semiconductor devices 330 through 350 with one another.

The package 300 may be implemented as a hybrid memory cube (HMC) having a structure in which the memory controller and a memory cell array die are stacked. When the package 300 is implemented as the HMC, the performance of the memory device 100 increases due to the increased bandwidth, and an area occupied by the memory device 100 is minimized. As a result, power consumption and manufacturing cost may be reduced.

Figure 11:
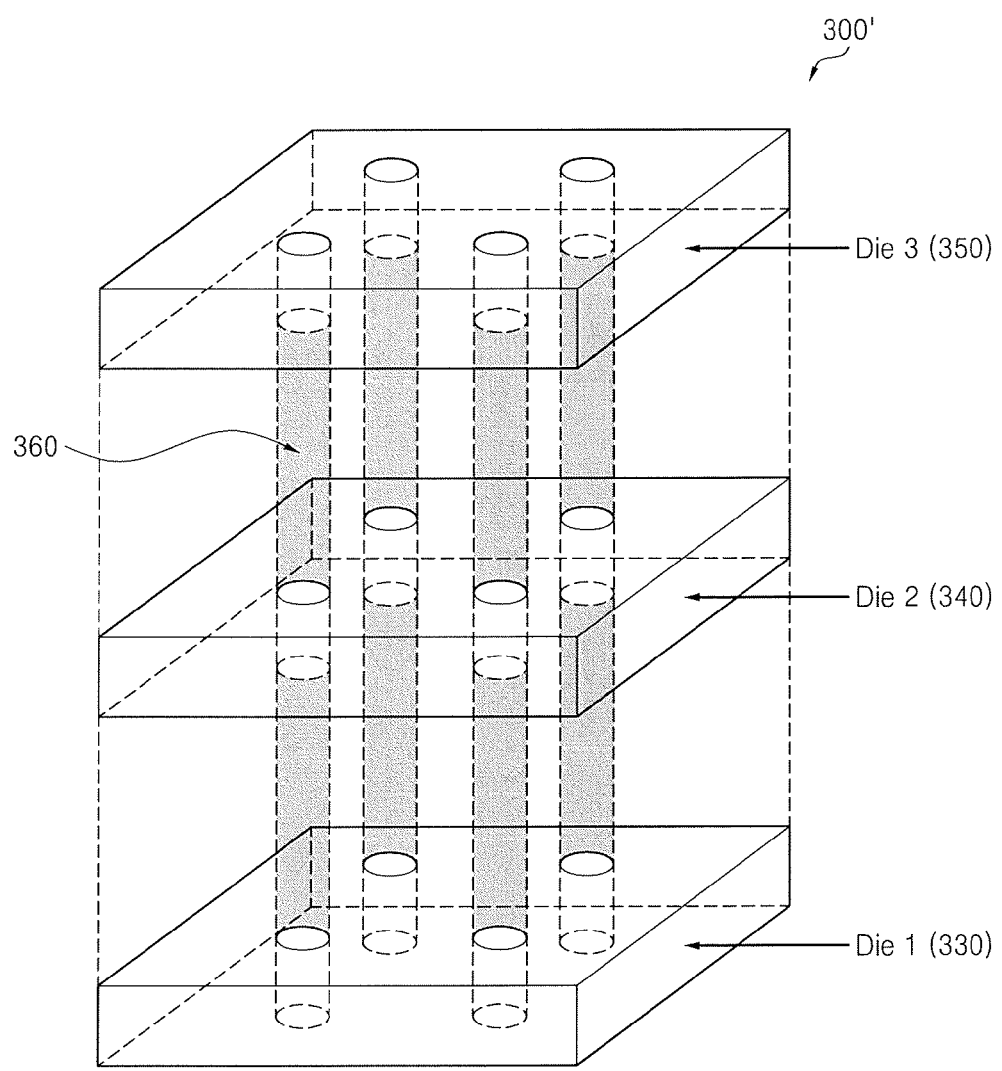
FIG. 11 is a conceptual diagram illustrating a package including the memory device illustrated in FIG. 1 in three dimensions according to an exemplary embodiment of the inventive concept.

FIG. 11 is a conceptual diagram illustrating a package 300' including the memory device 100 illustrated in FIG. 1 in three dimensions according to an exemplary embodiment of the inventive concept. Referring to FIGS. 1, 10, and 11, the package 300' includes a plurality of dies 330 through 350 connected through a TSV 360 with one another in a stack structure.

Figure 12:
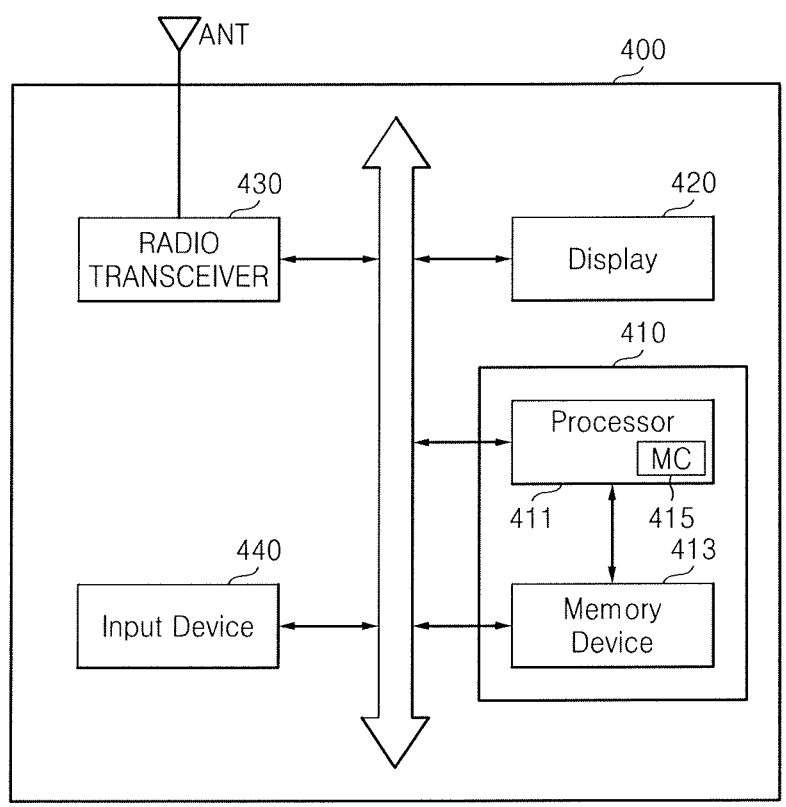
FIG. 12 is a block diagram of a system including the memory device illustrated in FIG. 1 according to an exemplary embodiment of the inventive concept.

FIG. 12 is a block diagram of a system 400 including the memory device illustrated in FIG. 1 according to an exemplary embodiment of the inventive concept. Referring to FIGS. 1, and 10 through 12, the system 400 may be implemented as an electronic system or a portable device. The portable device may be implemented as a cellular phone, a smart phone, or a tablet personal computer (PC).

The system 400 includes a processor 411 and a memory device 413. The memory device 413 may be the memory device 100 in FIG. 1.

According to an exemplary embodiment of the inventive concept, the processor 411 and the memory device 413 are implemented by a package 410. In this case, the package 410 may be mounted on a system board (not shown). The package 410 may correspond to the package 300 in FIG. 10 or the package 300' in FIG. 11.

The processor 411 includes a memory controller 415 (MC) controlling the test operations and the data processing operations, e.g., a write operation, or a read operation, of the memory device 413.

The memory controller 415 is controlled by the processor 411 controlling the overall operation of the system 400. According to an exemplary embodiment of the inventive concept, the memory controller 415 is connected between the processor 411 and the memory device 413.

The data programmed in the memory device 413 may be displayed through a display 420 according to the control of the processor 411.

A radio transceiver 430 transmits or receives radio signals through an antenna ANT. The radio transceiver 430 may convert radio signals received through the antenna ANT into signals that can be processed by the processor 411. Accordingly, the processor 411 may process the signals output from the radio transceiver 430 and store the processed signals in the memory device 413 or display the processed signals through the display 420. The radio transceiver 430 may also convert signals output from the processor 411 into radio signals and output the radio signals to an external device through the antenna ANT.

An input device 440 enables control signals for controlling the operation of the processor 411 or data to be processed by the processor 411 to be input to the system 400. The input device 440 may be implemented by a pointing device such as a touch pad or a computer mouse, a keypad, or a keyboard.

The processor 411 may control the operation of the display 420 to display data output from the memory device 413, data output from the radio transceiver 430, or data output from the input device 440.

A data bus may be located within the system 400 that enables devices such as the package 410, the display 420, the radio transceiver 430, and the input device 440 to communicate with one another.

Figure 13:
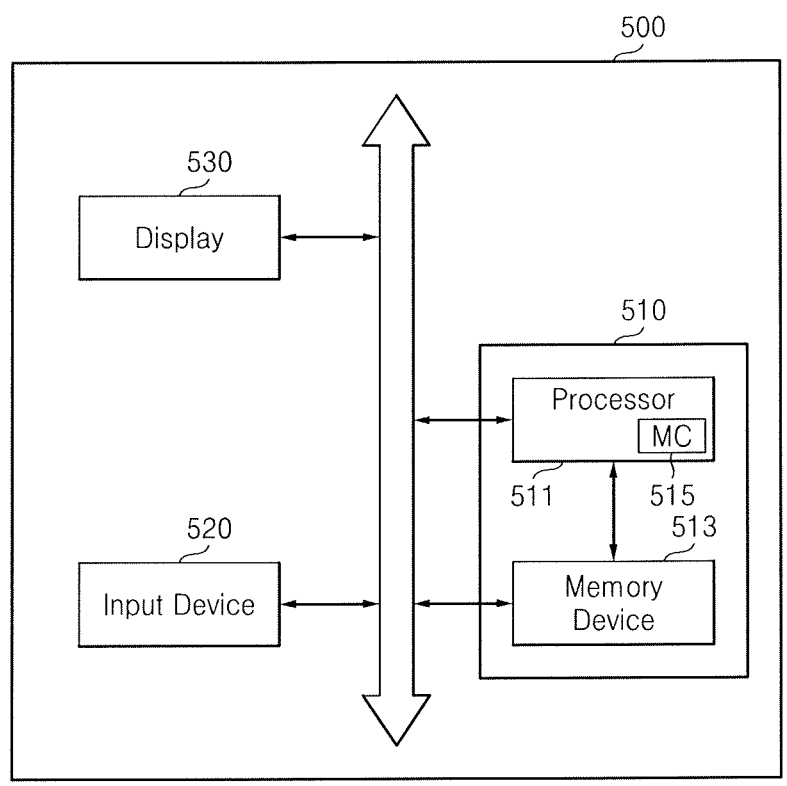
FIG. 13 is a block diagram of a system including the memory device illustrated in FIG. 1 according to an exemplary embodiment of the inventive concept.

FIG. 13 is a block diagram of a system 500 including the memory device illustrated in FIG. 1 according to an exemplary embodiment of the inventive concept. Referring to FIGS. 1, 10, 11 and 13, the system 500 may be implemented as a personal computer (PC), a tablet PC, a net-book, an e-reader, a personal digital assistant (PDA), a portable multimedia player (PMP), an MP3 player, or an MP4 player.

The system 500 includes a processor 511 controlling the overall operation of the system 500 and a memory device 513. The memory device 513 may be the memory device 100 in FIG. 1.

According to an exemplary embodiment of the inventive concept, the processor 511 and the memory device 513 are implemented by a package 510. In an exemplary embodiment, the package 510 is mounted on a system board (not shown). The package 510 may corresponds to the package 300 in FIG. 10 or the package 300' in FIG. 11.

The processor 511 may include a memory controller 515 controlling the operations of the memory device 513.

The processor 511 may display data stored in the memory device 513 through a display 530 according to data input through an input device 520. The input device 520 may be implemented by a pointing device such as a touch pad or a computer mouse, a keypad, or a keyboard.

A data bus may be located within the system 500 that enables devices such as the package 510, the input device 520 and the display 530 to communicate with one another.

Figure 14:
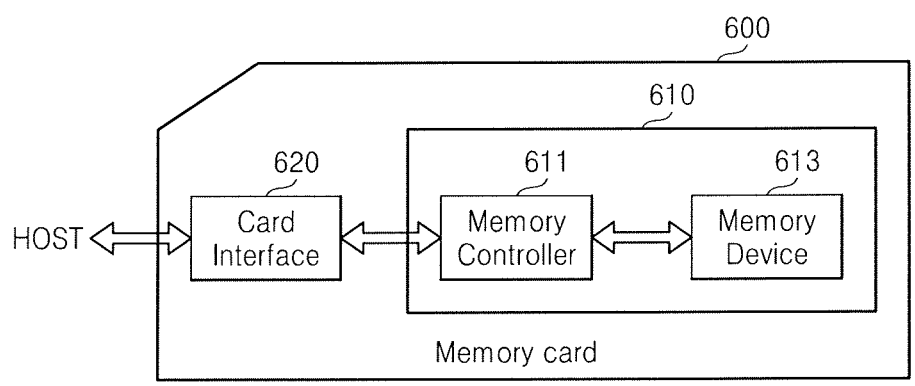
FIG. 14 is a block diagram of a system including the memory device illustrated in FIG. 1 according to an exemplary embodiment of the inventive concept.

FIG. 14 is a block diagram of a system 600 including the memory device illustrated in FIG. 1 according to an exemplary embodiment of the inventive concept. Referring to FIGS. 1, 10, 11 and 14, the system 600 may be implemented as a memory card or a smart card. The system 600 includes the memory device 613, a memory controller 611, and a card interface 620. The memory device 613 may be the memory device 100 in FIG. 1.

According to an exemplary embodiment of the inventive concept, the memory device 613 and the memory controller 611 may be implemented by a package 610. The package 610 may be mounted on a system board (not shown). The package 610 may correspond to the package 300 in FIG. 10 or the package 300' in FIG. 11.

The memory controller 611 may control data exchange between the memory device 613 and the card interface 620. The card interface 620 may be a secure digital (SD) card interface or a multi-media card (MMC) interface, but the inventive concept is not restricted thereto.

The card interface 620 may interface a host and the memory controller 611 for data exchange according to a protocol of the host.

When the system 600 is connected with the host such as a PC, a tablet PC, a digital camera, a digital audio player, a cellular phone, a console video game hardware, or a digital set-top box, the host may perform data communication with the memory device 613 through the card interface 620 and the memory controller 611.

Figure 15:
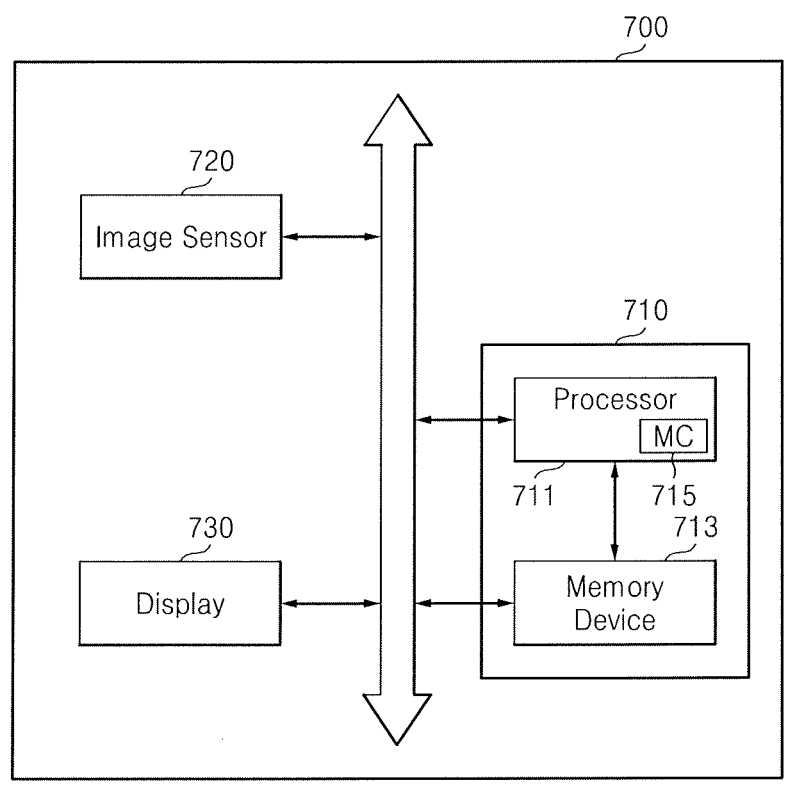
FIG. 15 is a block diagram of a system including the memory device illustrated in FIG. 1 according to an exemplary embodiment of the inventive concept.

FIG. 15 is a block diagram of a system 700 including the memory device illustrated in FIG. 1 according to an exemplary embodiment of the inventive concept. Referring to FIGS. 1, 10, 11 and 15, the system 700 may be implemented as a digital camera, or a portable device equipped with a digital camera.

The system 700 includes a processor 711 controlling the overall operation of the system 700 and a memory device 713. The memory device 713 may be the memory device 100 in FIG. 1. The processor 711 includes MC 715.

According to an exemplary embodiment of the inventive concept, the processor 711 and the memory device 713 may be implemented by a package 710. The package 710 may be mounted on a system board (not shown). The package 710 may correspond to the package 300 in FIG. 10 or the package 300' in FIG. 11.

An image sensor 720 included in the system 700 converts optical images into digital signals. For example, the image sensor 720 may include a digital charge coupled device (CCD) or a complementary metal-oxide-semiconductor (CMOS) active pixel sensor. The digital signals may be controlled by the processor 711 to be stored in the memory device 713 or to be displayed through a display 730. The digital signals stored in the memory device 713 may be controlled by the processor 711 to be displayed through a display 730.

The system 700 may include a data to enable devices such as the package 710, image sensor 720, and the display 730 to communicate with one another.

Figure 16:
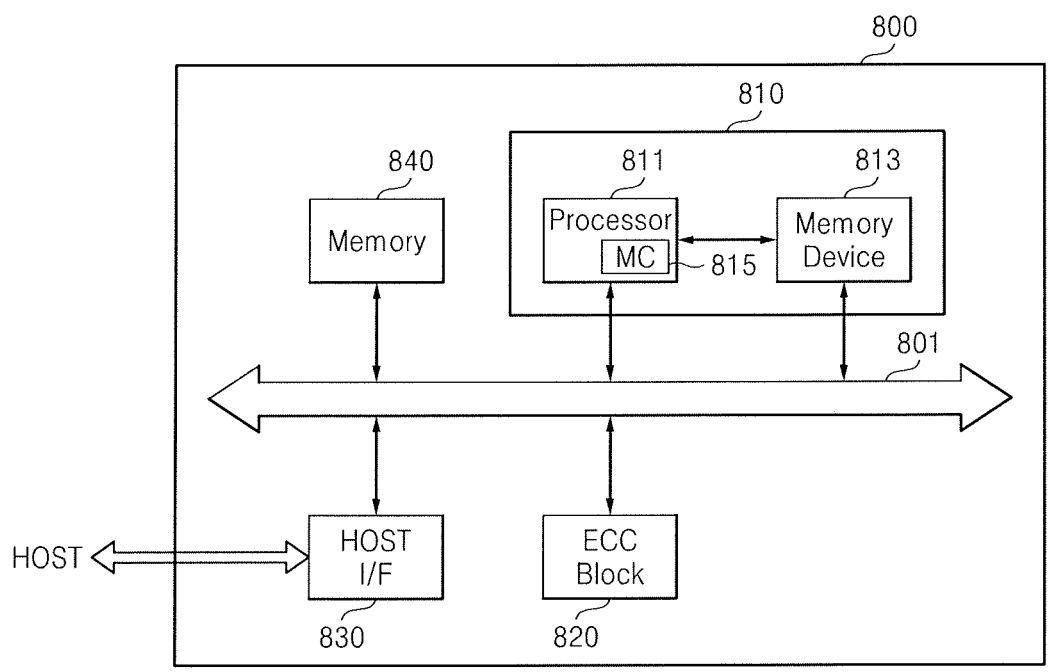
FIG. 16 is a block diagram of a system including the memory device illustrated in FIG. 1 according to an exemplary embodiment of the inventive concept.

FIG. 16 is a block diagram of a system 800 including the memory device illustrated in FIG. 1 according to an exemplary embodiment of the inventive concept. Referring to FIGS. 1, 10, 11 and 16, the system 800 includes the memory device 813 and a processor 811 controlling the overall operations of the system 800. The memory device 813 may be the memory device 100 in FIG. 1.

According to an exemplary embodiment of the inventive concept, the memory device 813 and the processor 811 may be implemented by a package 810. The package 810 may be mounted on a system board (not shown). The package 810 may correspond to the package 300 in FIG. 10 or the package 300' in FIG. 11.

The processor 811 includes a memory controller 815 controlling the operations of the memory device 813.

The system includes a memory 840 which may be used as an operation memory. The memory 840 may be implemented as a non-volatile memory such as a read-only memory (ROM) or a flash memory.

A host connected with the system 800 may perform data communication with the memory device 813 through the processor 811 and a host interface 830.

According to an exemplary embodiment of the inventive concept, the system may further include an error correction code (ECC) block 820.

The ECC block 820 is controlled by the processor 811 to detect an error bit included in data output from the memory device 813 through the memory controller 815 and correct the error bit. The CPU processor 811 may control data communications among the ECC block 820, the host interface 830, and the memory 840 through a bus 801.

The system 800 may be implemented as a universal serial bus (USB) memory drive, or a memory stick.

Figure 17:
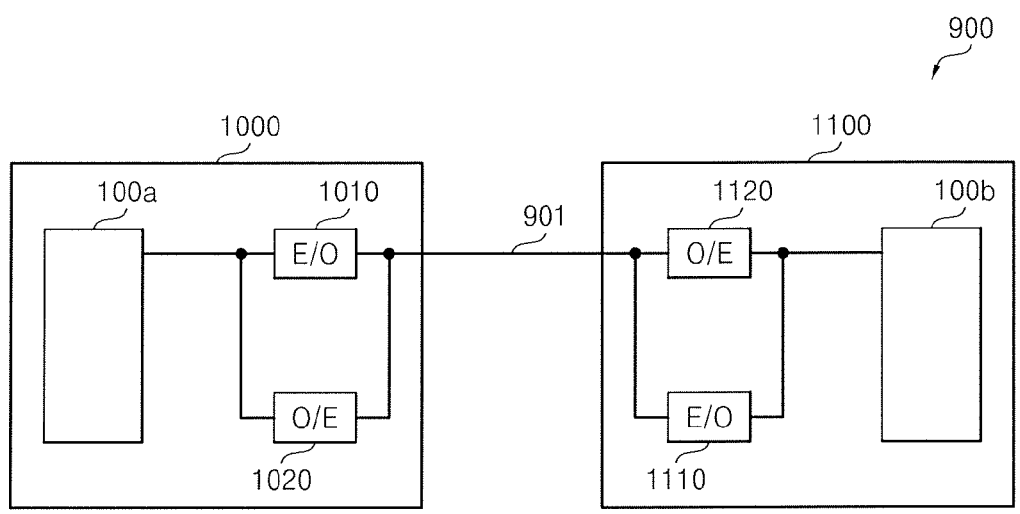
FIG. 17 is a diagram of a system including the memory device illustrated in FIG. 1 according to an exemplary embodiment of the inventive concept.

FIG. 17 is a diagram of a system 900 including the memory device illustrated in FIG. 1 according to an exemplary embodiment of the inventive concept. A channel 901 may be an optical connection means. The optical connection means may be an optical fiber, an optical waveguide, or a medium that transmits an optical signal.

Referring to FIGS. 1 and 17, the system 900 may include a first system 1000 and a second system 1100. The first system 1000 may include a first memory device 100a and an electro-optic (E/O) conversion circuit 1010. The E/O conversion circuit 1010 may convert an electrical signal output from the first memory device 100a into an optical signal and output the optical signal to the second system 1100 through the optical connection means 901.

The second system 1100 may include an opto-electric (O/E) conversion circuit 1120 and a second memory device 100b. The O/E conversion circuit 1120 may convert an optical signal input through the optical connection means 901 into an electrical signal and transmit the electrical signal to the second memory device 100*b*.

The first system 1000 may also include an O/E conversion circuit 1020 and the second system 1100 may also include an E/O conversion circuit 1110. When the second system 1100 transmits data to the first system 1000, the E/O conversion circuit 1110 may convert an electrical signal output from the second memory device 100*b* into an optical signal and output the optical signal to the first system 1000 through the optical connection means 901. The O/E conversion circuit 1020 may convert the optical signal received through the optical connection means 901 into an electrical signal and transmit the electrical signal to the first memory device 100*a*. The structure and the operation of the memory devices 100*a* and 100*b* may be substantially the same as those of the memory device 100 illustrated in FIG. 1.

As described above, according to at least one embodiment of the inventive concept, a type of defect of memory cells included in a memory device may be accurately determined, so that the defect of the memory cells is properly processed.

At least one embodiment of the inventive concept can be embodied as computer-readable codes having computer executable instructions on a computer-readable medium. For example, the operations of FIGS. 3, 5, 6, 8, and 9 may be embodied as computer executable instructions. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices.

While the inventive concept has been particularly shown and described with reference to exemplary embodiments thereof, it will be understood that various changes in forms and details may be made therein without departing from the spirit and scope of the inventive concept.

What is claimed is:

1. A memory device comprising:
a control logic configured to control an overall operation of the memory device;
a data storing unit configured to receive write data and write the write data according to control of the control logic and to output read data obtained by reading the write data; and
a detector configured for repeating generation of a comparison result based on the read data and a current determination result based on the comparison result and a previous determination result N times and to generate a final determination result according to a result of the repeating,
where N is an integer of at least 2,
wherein the final determination result indicates whether an error has occurred and a type of the error.

2. The memory device of claim 1, wherein the data storage unit comprises a memory cell array comprising a plurality of memory cells, wherein the comparison result is a result of comparing the write data with the read data, wherein the write data is data to be written to a memory cell corresponding to a first address among the plurality of memory cells, and wherein the read data is data read from the memory cell corresponding to the first address after the write data is written to the memory cell corresponding to the first address.

3. The memory device of claim 1, further comprising:
an address buffer configured to receive address information from an external device outside the memory device and to transmit the address information to the data storing unit according to the control of the control logic;
a command buffer configured to receive a command from the external device outside the memory device and to transmit the command to the control logic; and a data input/output circuit configured to exchange the read data and the write data with the external device outside the memory device or the data storing unit according to the control of the control logic,
wherein the data storing unit comprises:
a memory cell array comprising a plurality of memory cells, a plurality of word lines, and a plurality of bit lines;
a row decoder and row driver block configured to select at least one of the word lines according to the address information;
a column decoder and column driver block configured to select at least one of the bit lines according to the address information; and
a write driver and sense amplifier block configured to write the write data to at least one memory cell selected according to the address information or to read the read data from the at least one memory cell.

4. The memory device of claim 1, wherein the detector comprises:
a data storing circuit configured to store the write data and to output the write data and the read data;
a data comparing circuit configured to compare the write data with the read data to generate the comparison result; and
a defective type determination circuit configured to generate the current determination result based on the comparison result and the previous determination result and to store the current determination result as the previous determination result.

5. The memory device of claim 4,
wherein the data storing circuit comprises a first latch configured to store the write data;
the data comparing circuit comprises an exclusive OR (XOR) gate configured to compare the write data with the read data; and
the defective type determination circuit comprises a second latch configured to store the previous determination result, an AND gate configured to compare the previous determination result with the current determination result, and a counter configured to count a number of times of generation of the current determination result.

6. The memory device of claim 2, wherein when the control logic receives a test mode register set (MRS) command, the first address is determined based on the address information received from an external device outside the memory device and the write data is data that a data input/output circuit of the memory device receives from the external device.

7. The memory device of claim 2, wherein when the control logic receives a built in self test (BIST) command, the first address is determined according to BIST address information determined by the control logic and the write data is determined by the control logic.

8. The memory device of claim 1, wherein the data storage unit comprises a memory cell array comprising a plurality of memory cells, wherein the comparison result is a result of comparing a first read data among the read data with a second read data among the read data, wherein the first read data is data read from memory cells corresponding to a first address among the plurality of memory cells, and wherein the second read data is data read from the memory cells corresponding to the first address after the first read data is read and the write data is written to the memory cell corresponding to the first address.

9. The memory device of claim 8, wherein the detector comprises:
   a data storing circuit configured to store the first read data and to output the first read data and the second read data;
   a data comparing circuit configured to compare the first read data with the second read data and to generate the comparison result; and
   a defective type determination circuit configured to generate the current determination result based on the comparison result and the previous determination result and to store the current determination result as the previous determination result.

10. A memory system comprising:
    a memory device including a plurality of memory cells; and
    a memory controller configured to transmit a command for controlling the memory device,
    wherein the memory device comprises:
       a control logic configured to control an overall operation of the memory device according to the command;
       a data storing unit configured to receive write data and write the write data according to control of the control logic and to output read data obtained by reading the write data; and
       a write error rate (WER) detector configured for repeating generation of a comparison result based on the read data and a current determination result based on the comparison result and a previous determination result N times and to generate a final determination result according to a result of the repeating, where N is an integer of at least 2.

11. A method of operating a memory device, the method comprising:
    generating a current determination result based on a previous determination result and a comparison result generated based on read data read from a memory cell corresponding to a first address;
    storing the current determination result as the previous determination result;
    repeating the generating the current determination result and the storing the current determination result until the current determination result is generated N times,
    where N is an integer of at least 1; and generating a final determination result according to a result of the repeating,
    wherein the final determination result indicates whether the memory cell corresponding to the first address has an error and a type of the error.

12. The method of claim 11, wherein the comparison result is a result of comparing write data to be written to the memory cell corresponding to the first address with the read data obtained by reading the write data from the memory cell corresponding to the first address.

13. The method of claim 12, wherein the generating the current determination result comprises:
    storing the write data in a detector that generates the current determination result; writing the write data to the memory cell corresponding to the first address; and
    generating the comparison result based on the read data obtained by reading the write data from the memory cell corresponding to the first address and the write data stored in the detector.

14. The method of claim 13, wherein the generating the current determination result further comprises receiving a mode register set (MRS) command, address information designating the first address, and the write data.

15. The method of claim 13, further comprising receiving a built in self test (BIST) command and determining the first address and the write data.

16. The method of claim 11, wherein the comparison result is a result of comparing first read data read from the memory cell corresponding to the first address and second read data read from the memory cell corresponding to the first address after the first read data is read.

17. The method of claim 16, wherein the generating the current determination result comprises:
    storing the first read data in a detector that generates the current determination result;
    writing write data to the memory cell corresponding to the first address; and
    generating the comparison result based on the second read data obtained by reading the write data from the memory cell corresponding to the first address and the first read data stored in the detector.

18. The method of claim 17, wherein the generating the current determination result further comprises receiving a test mode register set (MRS) command, address information designating the first address, and the write data.

19. The method of claim 17, further comprising receiving a built in self test (BIST) command and determining the first address and the write data.

20. The method of claim 11, wherein N is determined based on a write error rate of a memory cell array.

* * * * *